United States Patent
Farahani et al.

(10) Patent No.: US 8,686,277 B2
(45) Date of Patent: Apr. 1, 2014

(54) MICROELECTRONIC ASSEMBLY INCLUDING BUILT-IN THERMOELECTRIC COOLER AND METHOD OF FABRICATING SAME

(75) Inventors: Mohammad M. Farahani, Austin, TX (US); Gregory Chrysler, Chandler, AZ (US); Kris Frutschy, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 1717 days.

(21) Appl. No.: 11/024,357

(22) Filed: Dec. 27, 2004

(65) Prior Publication Data

US 2006/0137732 A1  Jun. 29, 2006

(51) Int. Cl.
*H01L 35/02* (2006.01)

(52) U.S. Cl.
USPC .......... 136/201; 136/205; 62/3.3; 62/3.2; 257/712; 257/467; 257/470; 257/930

(58) Field of Classification Search
USPC .......... 136/201, 205; 62/3.3, 3.2; 257/712, 257/467, 470, 930
See application file for complete search history.

(56) References Cited

U.S. PATENT DOCUMENTS

| | | | |
|---|---|---|---|
| 5,837,929 A * | 11/1998 | Adelman | 136/225 |
| 6,250,085 B1 | 6/2001 | Tousson | |
| 6,274,803 B1 * | 8/2001 | Yoshioka et al. | 136/201 |
| 6,559,538 B1 | 5/2003 | Pomerene et al. | |
| 6,614,109 B2 | 9/2003 | Cordes et al. | |
| 6,674,128 B1 | 1/2004 | Fisher | |
| 6,800,933 B1 | 10/2004 | Mathews et al. | |
| 7,352,063 B2 | 4/2008 | Noguchi | |
| 2001/0017369 A1 * | 8/2001 | Iwasaki et al. | 257/10 |
| 2002/0092307 A1 | 7/2002 | Ghoshal | |
| 2003/0041892 A1 * | 3/2003 | Fleurial et al. | 136/227 |
| 2004/0118129 A1 * | 6/2004 | Chrysler et al. | 62/3.2 |

FOREIGN PATENT DOCUMENTS

| | | |
|---|---|---|
| JP | 03-167870 | 7/1991 |
| JP | 09-064255 | 3/1997 |
| JP | 11-214598 | 8/1999 |
| JP | 2003-243731 | 8/2003 |
| JP | 2004-165677 | 6/2004 |
| JP | 2004-228485 | 8/2004 |
| TW | 94146538 | 6/2006 |

OTHER PUBLICATIONS

European Patent Office, International Search Report and Written Opinion for International Application No. PCT/US2005/047594, 13 pages, May 8, 2006.
PCT International Search Report and Written Opinion, for PCT/US2005/047594 mailed May 8, 2006, 11 pages.

* cited by examiner

*Primary Examiner* — Golam Mowla
(74) *Attorney, Agent, or Firm* — Blakely, Sokoloff, Taylor & Zafman LLP (57) ABSTRACT

A method for fabricating a microelectronic assembly including a built-in TEC, a microelectronic assembly including a built-in TEC, and a system including the microelectronic assembly. The method includes providing a microelectronic device, and fabricating the TEC directly onto the microelectronic device such that there is no mounting material between the TEC and the microelectronic device.

13 Claims, 10 Drawing Sheets

MICROELECTRONIC ASSEMBLY INCLUDING BUILT-IN THERMOELECTRIC COOLER AND METHOD OF FABRICATING SAME

FIELD

Embodiments of the present invention relate to thermoelectric coolers for microelectronic devices.

BACKGROUND

The need for cooling microelectronic devices such as integrated circuit dice during operation is well recognized in the art. Typically, spot cooling of such devices as a result of non-uniform die power maps is needed in order to ensure reliable operation of the same, and in order to prevent device failure as a result of sustained elevated temperatures.

The cooling of microelectronic devices has been effected in various ways according to the prior art. Examples of current high volume manufacturing solutions for cooling microelectronic devices include cooling designs based upon liquid circulation or refrigeration. However, the latter solutions have proven to be costly. As an alternative, stand-alone thermoelectric coolers (hereinafter "TEC"'s) have been made available in order to offer a less costly and yet effective cooling option. As is well known, TEC's function based on the Peltier effect, according to which the passage of an electrical current through a junction including two dissimilar materials results in a cooling effect. When the current flow is reversed, a heating effect may be observed.

Current TEC's are generally fabricated according to three different regimes. According to a first regime, a single crystal ingot of TE material, such as a Bi or Te based alloy (for example, Bi2Te3 or BiSb), or such as PbTe or Si Ge, is provided. The ingot is then sliced into wafers, which are then diced into accurately sized blocks. Appropriate ones of the blocks are then P-doped (for example, with antimony) and N-doped (for example, with selenium) as desired to yield thermoelements. Thereafter, pairs of P- and N-doped thermoelements are plated with Ni, soldered in place along with undoped thermoelements, and sandwiched between metallized substrates to form a couple. The couple includes a pair of thermoelements consisting of one N-type and one P-type thermoelement connected electrically in series and thermally in parallel. The substrates may be made of alumina ceramic, although berylia ceramic and other materials may also be used. A number of couples may be joined together, such as via soldering, in order to form the TEC. For example, a single-stage module could be formed, which includes a single layer of thermoelectric couples. Thereafter, the TEC is mounted to a microelectronic device to cool the same. Mounting may be effected via compression with a thermal interface pad or thermal grease, solder or epoxy. The resulting assembly is a TEC mounted to a microelectronic device by way of a mounting material disposed therebetween, such as thermal grease, epoxy or solder.

According to a second regime, instead of working from an ingot as noted above, the thermoelements are fabricated by sputtering. In particular, three sputtering targets, typically made of TE material, are used to sputter the P-type, N-type, and undoped thermoelements. The thus formed thermoelements are then joined together electrically in series and thermally in parallel in order to form the TEC. The TEC may then be mounted to a microelectronic device as noted above.

According to a third regime, the thermoelements may have a superlattice structure. A superlattice structure is typically a structure consisting of alternating layers of two different semiconductor materials, each several nanometers thick. For example, a P- or N-type thermoelement may be made of alternating layers of P- or N-type semiconductor materials. Each of the layers is generally in the order of about 10 nm thick. A superlattice P-type thermoelement may include alternating layers of P-type bismuth chalcogenide materials, such as, for example, alternating layers of $Bi_2Te_3/Sb_2Te_3$ with layers of $Bi_{0.5}Sb_{1.5}Te_3$. A superlattice N-type thermoelement may include alternating layers of P-type bismuth chalcogenide materials, such as, for example, alternating layers of $Bi_2Te_3$ with alternating layers of $Bi_2Se_3$. The respective superlattice structures may also be constructed from cobalt antimony skutteridite materials. Each of the layers of a superlattice thermoelement as noted above is joined to an adjacent layer via soldering, typically achieving a structure which is about 5 microns thick. The thus formed thermoelements are then joined together as noted above to form the TEC, which may then be mounted to a microelectronic device as noted above.

Disadvantageously, TEC's of the prior art are limited in their application for a number of reasons. Currently available TEC's do not necessarily accommodate heat removal requirements specific to a particular microelectronic device. In addition, such TEC's are limited in their heat flux capabilities by virtue of their thicknesses, which are typically in the range of millimeters. Moreover, the mounting materials necessary to mount currently available TEC's to the backside of microelectronic devices disadvantageously add to the thermal contact resistance of the overall package, thus compromising heat removal efficiency.

BRIEF DESCRIPTION OF THE DRAWINGS

Embodiments of the invention are illustrated by way of example and not by way of limitation in the figures of the accompanying drawings, in which the like references indicate similar elements and in which:

FIGS. 2-10d illustrate various stages in the fabrication of the assembly of FIG. 1;

DETAILED DESCRIPTION

A method for fabricating a microelectronic assembly including a built-in thermoelectric cooler, a microelectronic assembly including a built-in thermoelectric cooler, and a system including the microelectronic assembly are disclosed herein.

Various aspects of the illustrative embodiments will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

Various operations will be described as multiple discrete operations, in turn, in a manner that is most helpful in understanding the present invention, however, the order of description should not be construed as to imply that these operations are necessarily order dependent. In particular, these operations need not be performed in the order of presentation.

The phrase "in one embodiment" is used repeatedly. The phrase generally does not refer to the same embodiment, however, it may. The terms "comprising", "having" and "including" are synonymous, unless the context dictates otherwise.

Figure 1:
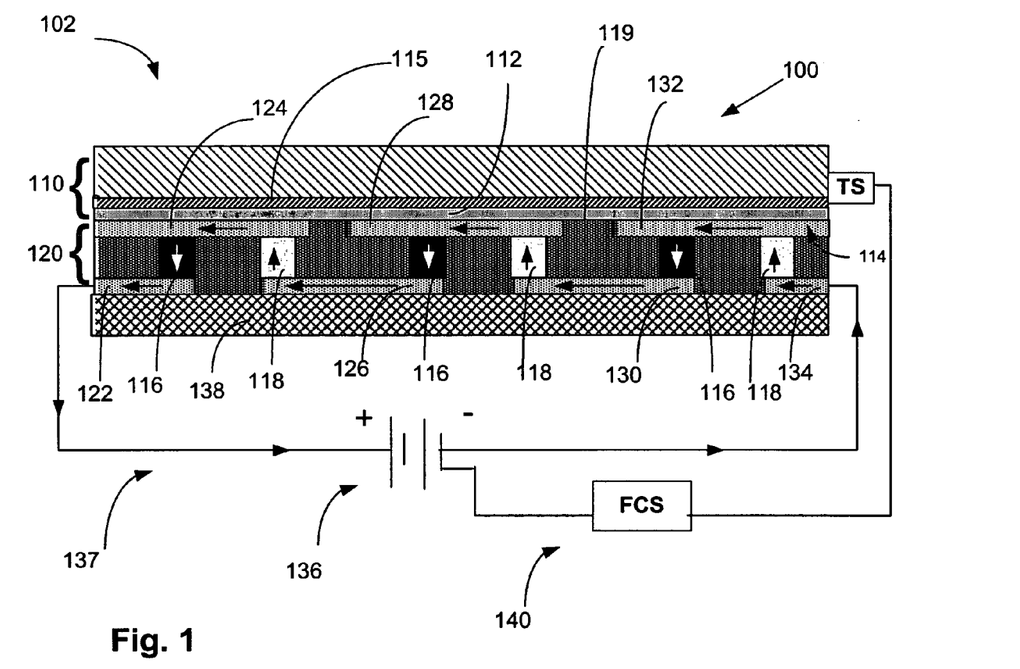
FIG. 1 illustrates a microelectronic assembly including a microelectronic device having a built-in TEC according to an embodiment.

Referring first to FIG. 1, an arrangement 102 is shown including a microelectronic assembly 100 formed according to an embodiment of the present invention. Arrangement 102 further includes electrical circuit 137 and feedback control loop 140 as will be described further below. The assembly 100 includes a microelectronic device, such as a die 110. Optionally, as shown in FIG. 1, die 110 may include an initial oxide layer 112 on its backside 114 (that is, on its side including the built-in TEC) provided in order to prevent interdiffusion between interconnect metallization conductive elements 124, 128 and 132 on the one hand and silicon substrate 115 of die 110 on the other hand, and further to provide a layer of electrical insulation. Providing electrical insulation may be needed since the interconnect metallization conductive elements (122, 124, 126, 128, 130, 132 and 134) could otherwise short. Oxide layer 112 may comprise a silicon oxide layer, and be grown onto the backside 114 of die 110 according to any of well known methods. Preferably, oxide layer 112 is thermally grown onto the backside 114 of die 110 in a vertical diffusion furnace. The assembly 100 further includes a TEC 120 that has been built onto the microelectronic device according to an embodiment of the present invention. As shown in FIG. 1, there is an absence of mounting materials between TEC 120 and die 110. By "mounting materials," what is meant in the context of the present invention is a material that brings about a physical attachment of one microelectronic component to another, examples of mounting materials including, but not being limited to, solder, thermal grease, and epoxy. TEC 120 in the shown embodiment includes pairs of N-type electrodes 116 and P-type electrodes 118 as shown, the electrodes being made of a TE material, such as, for example, a Bi or Te based alloy (for example, Bi2Te3 or BiSb), or such as PbTe or Si Ge, it being understood that other types of TE materials would be within the scope of embodiments of the present invention. The TE material of the electrodes is doped with conventional dopants as appropriate, such as, for example, phosphorus, arsenic, antimony, bismuth, selenium and tellurium used as N-type dopants, and boron, aluminum, gallium and indium used as P-type dopants. The P- and N-type electrodes are separated by a patterned oxide layer 119, which may be provided using any one of well known methods, as would be recognized by one skilled in the art. A function of oxide layer 119 is to electrically isolate the N- and P-type electrodes from one another. The N- and P-type electrodes are electrically coupled together via interconnect metallization conductive elements 122, 124, 126, 128, 130, 132 and 134 as shown. The conductive elements 122-134 may be made of any suitable electrically conductive material, such as, for example, an aluminum copper alloy (containing about 0.5% copper), or copper, the aluminum copper alloy containing about 0.5% copper being preferred. A thickness range of a TEC 120 according to embodiments of the present invention is between about 50 and about 200 microns, with the electrodes having a thickness range between about 20 microns and about 50 microns, and the conductive elements as having a thickness range between about 10 microns and about 100 microns.

The cooling of die 110 by TEC 120, results as a function of the Peltier effect. In particular, referring again to FIG. 1, a DC power source 136 is connected to the TEC thus forming a circuit 137 to power the same at conductive elements 122 and 134 as shown. Electrons in circuit 137 flow in the direction of the shown arrows through TEC 120 in circuit 137, and in doing so, extract heat from die 110 during the die's operation. The power discarded by the TEC at the hot end is equal to the power absorbed at the cold end backside of the die plus the power dissipated at the TEC. TEC 120 may be coupled to a conventional heat sink 138, such as for example, an integrated heat spreader (IHS), or a liquid cooled cold plate in order to dissipate the heat pumped away from die 110. Heat absorbed at the cold junction, that is, at an interface between die 110 and TEC 120, is pumped toward the hot junction, or interface between TEC 120 and heat sink 138, at a rate proportional to current passing through the circuit and to the number of couples consisting of pairs of N- and P-type electrodes. As shown in FIG. 1, the shown N- and P-couples are combined into a TEC module where they are connected electrically in series, and thermally in parallel. Typical voltages applied to TEC 120 may range from about 3 V to about 5 V, and could be up to 12 V. The local cooling provided by the TEC allows the overall power of the die to be increased without exceeding the maximum temperature specifications of the same, such as, for example, 100 degrees Celsius at any point on the die from its front side. Optionally, according to an embodiment of the present invention, a feedback control loop 140, as schematically shown in FIG. 1, may be coupled to the electrical circuit powered by power source 136 as shown. Feedback control loop 140 may include a temperature sensor TS schematically shown as having been coupled to die 110 in order to sense a temperature of the die. TS then communicates a signal to a feedback control system FCS which in turn regulates the current through TEC 120 for example by regulating a voltage of the power source 136 supplied to the TEC. Thus, feedback control loop 140 allows control of the extent of cooling provided by TEC 120 as a function of the temperature of die 110. FCS may include any of the conventional microprocessors for receiving a temperature signal from TS, for regulating the current through TEC 120 as per conventional methods.

It is noted that, while FIG. 1 and the figures to follow refer to element 110 as a die, embodiments of the present invention are not limited to a microelectronic assembly including a die, but encompass within their scope a microelectronic assembly comprising any microelectronic device apt to require cooling which may be effected by a TEC. In addition, although FIG. 1 shows a TEC module including a plurality of couples (that is, a plurality of electrically connected pairs of N- and P-type electrodes), embodiments of the present invention include within their scope TEC modules comprising a single couple.

Advantageously, embodiments of the present invention, such as, for example, assembly 100, significantly reduce a thermal contact resistance between the microelectronic device to be cooled and the TEC, thus allowing for a comparatively larger temperature reduction at the hot spot, and further reducing the input power required to the TEC to achieve the desired temperature management effects. Thus, compared to the TEC technology according to the state of the art, where the TEC is mounted to the microelectronic device to be cooled by way of a mounting material such as solder, thermal grease or epoxy, embodiments of the present invention provide a microelectronic assembly where the TEC is built-in as part of the assembly as opposed to being attached to a microelectronic device to be cooled via a mounting material, in this way substantially eliminating any thermal contact resistance between the device to be cooled and the TEC.

Referring next to FIGS. 2-9c, various stages of a method of fabricating a microelectronic assembly such as assembly 100 in FIG. 1 is shown. The various stages will be explained in further detail below.

Figure 2:
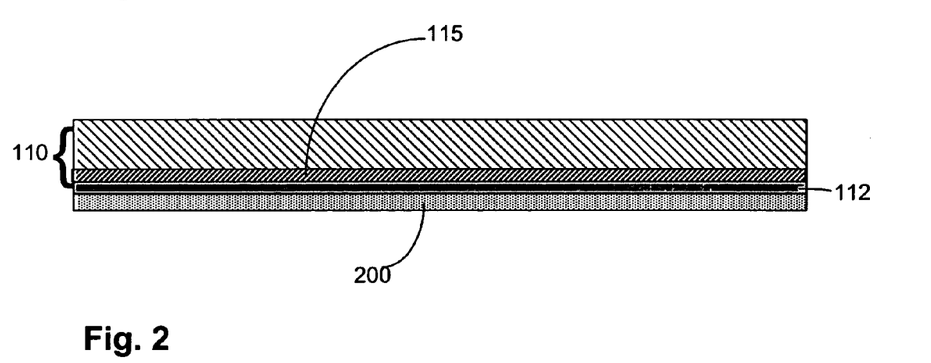

As seen in FIG. 2, a first stage in the fabrication of a microelectronic assembly including a built-in TEC includes providing a microelectronic device such as die 110, and providing a plurality of first conductive elements adapted to be electrically coupled to corresponding pairs of N- and P-type electrodes of the TEC. Provision of the plurality of conductive elements includes, according to some embodiments, first providing an interconnect metallization layer in the form of first conductive layer 200 on the die 110, and then providing an interconnect pattern in the first conductive layer 200 to yield the plurality of first conductive elements. As noted above, die 110 may include an initial layer of oxide 112 thereon First conductive layer 200 may in turn comprise any conductive material, such as, for example, an aluminum copper alloy containing about 0.5% copper, or copper alone, as noted above, and may be deposited by any of well know deposition methods for depositing metallization layers, such as, for example, sputtering or evaporation.

Figure 3A:
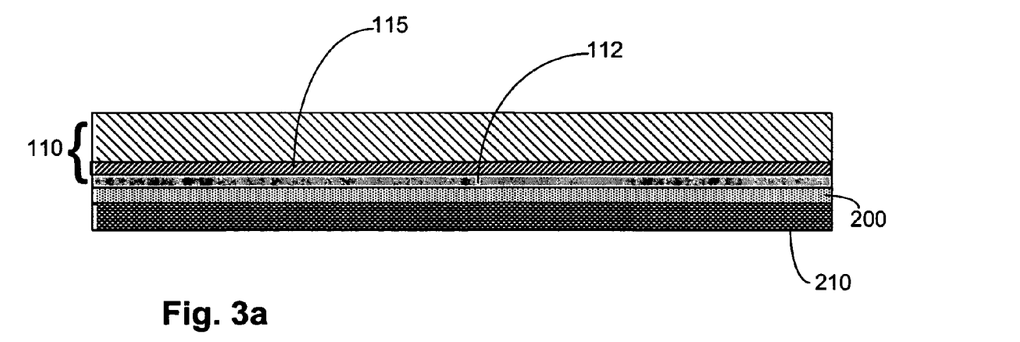

Referring next to FIG. 3a-3d, a method of fabricating a microelectronic assembly including a built-in TEC further includes providing an interconnect pattern in the first conductive layer 200. The provision of an interconnect pattern would result in the formation of distinct conductive elements from conductive layer 200 in order to power distinct couples of TEC 120. FIGS. 3a-3d depict one example of providing the interconnect pattern in first conductive layer 200, which example includes using lithography, or a mask/develop/etch procedure, in order to etch the interconnect pattern into layer 200. In particular, as seen in FIG. 3a, the provision of an interconnect pattern in layer 200 involves the provision of a resist layer 210 on first conductive layer 200. The resist layer may be provided according to any of well known techniques, such as, for example, through a spinning process using a coater or developer. The amount of resist dispensed, its viscosity, and the spin speed and time help determine the final resist thickness and uniformity, as would be recognized by one skilled in the art. Conventional resist deposition techniques may be used to provide resist layer 210 as shown according to embodiments of the present invention.

Figure 3B:
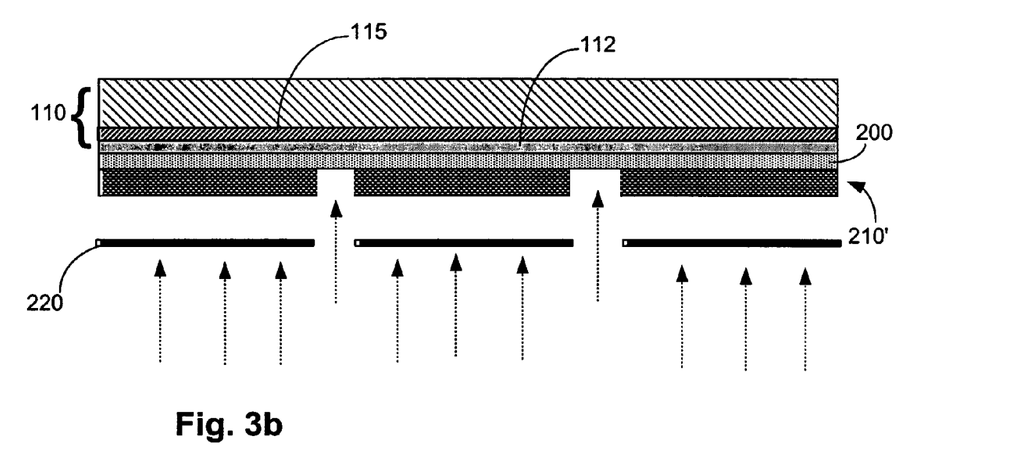

As next seen in FIG. 3b, predetermined portions of resist layer 210 are removed as a function of the interconnect pattern to be provided on layer 200. As shown in FIG. 3b, according to one embodiment, removal of the predetermined portions of resist layer 210 may be achieved by exposing resist layer 210 to light through a mask 220 as shown, the mask displaying a pattern corresponding to the interconnect pattern to be provided on layer 200, and thereafter by dissolving the exposed predetermined portions by using a developer solution. The interconnect pattern provided by the mask 220 is transferred onto the resist layer 210 by exposing the mask 220 and resist 210 to light, such as UV light, for example by way of a stepper, as suggested by way of broken arrows in FIG. 3b. The wavelength and intensity of the light, and the exposure time are all factors in properly exposing the pattern, as would be recognized by one skilled in the art. Conventional exposure parameters may be used according to embodiments of the present invention. Thereafter, exposed portions of resist layer may be dissolved away using a developer solution, as is well known in the art. The development time, temperature and concentration of the developer solution are all factors in properly dissolving the exposed resist, as would be recognized by one skilled in the art. Conventional exposure parameters may be used according to embodiments of the present invention. A removal of predetermined portions of resist layer 210 yields a patterned resist layer 210' exhibiting the interconnect pattern to be provided on layer 200.

Figure 3C:
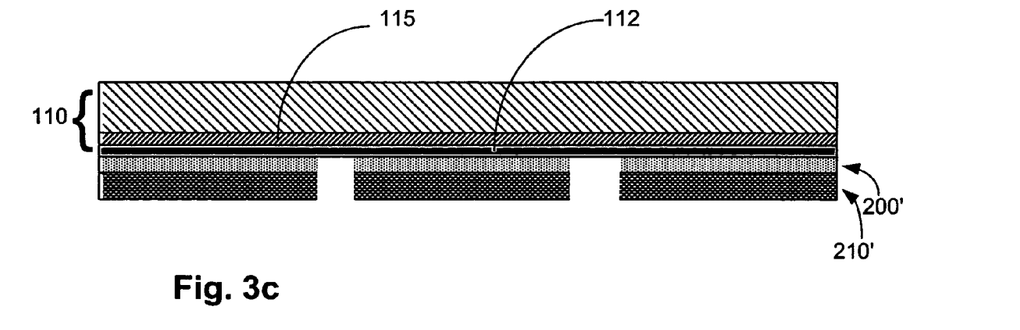
Figure 3D:
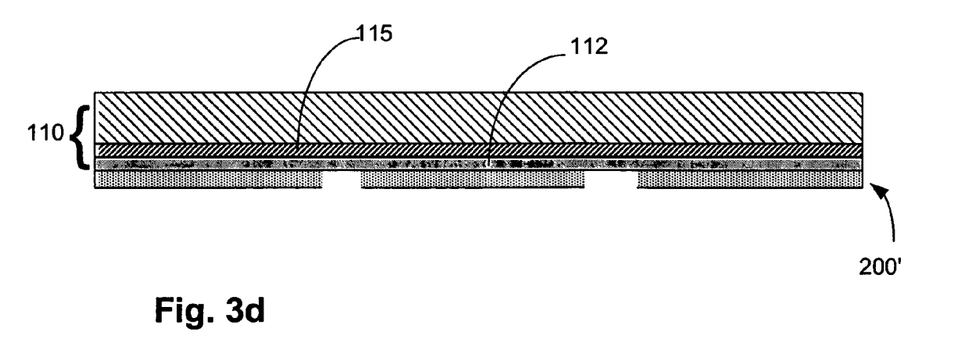

Referring next to FIG. 3c, predetermined portions of layer 200 are removed as a function of the interconnect pattern to be provided on layer 200. As shown in FIG. 3c, according to one embodiment, removal of the predetermined portions of layer 200 may be achieved by etching away portions of layer 200 not protected by patterned resist layer 210'. Conventional etching parameters may used according to embodiments of the present invention. For example, according to one embodiment, a plasma (dry) etcher, such as an Al etcher, may be used to etch away the unprotected predetermined portions of layer 230. The areas that are protected by resist will become the active areas of a patterned interconnect metallization layer 200' including first conductive elements 124, 128 and 132 shown in FIG. 1. As seen in FIG. 3d, once etching is complete, an asher (also a type of plasma etcher) may be used to burn off the remaining resist to yield a first patterned metallization layer 200'.

Figure 4:
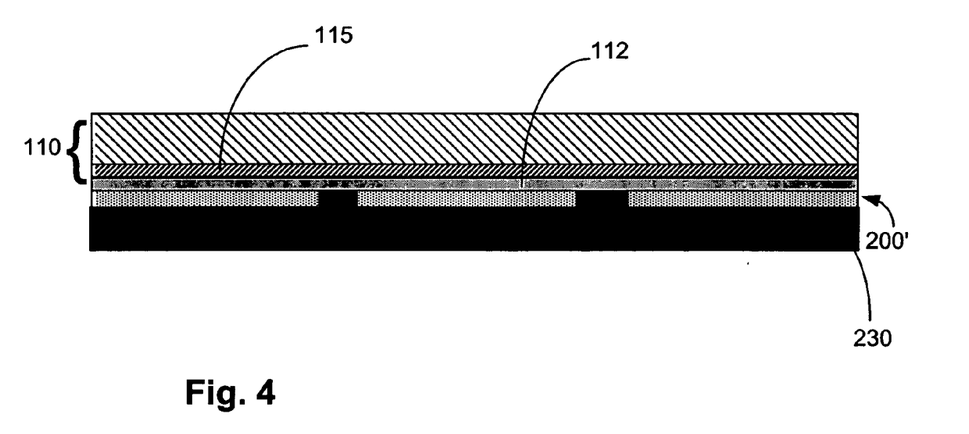

As seen in FIG. 4, a method of fabricating a microelectronic assembly including a built-in TEC further includes providing a N-type layer 230 of TE material on the patterned metallization layer 200'. Provision of the N-type layer 230 may include, according to one embodiment, CVD or PVD deposition of a TE material precursor implanted with dopants, or, in the alternative, CVD deposition of a TE material precursor followed by on site doping after deposition. N-type dopants may include, by way of example, phosphorus, arsenic, antimony, bismuth, selenium and tellurium.

Figure 5A:
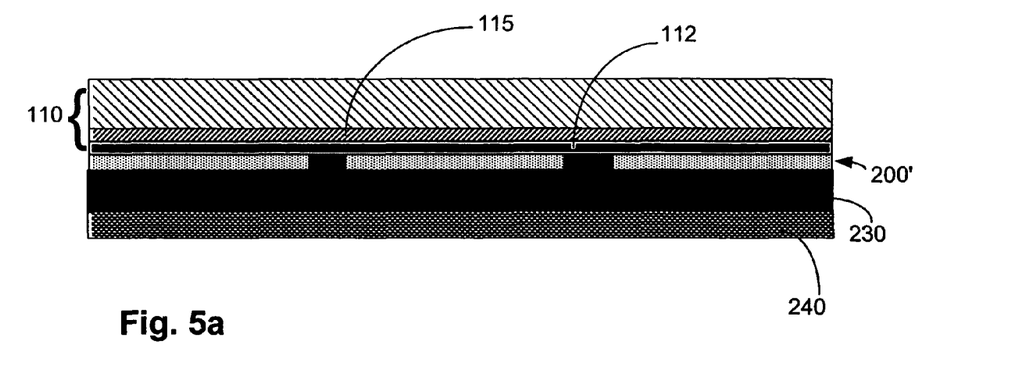

Referring next to FIGS. 5a-5d, a method of fabricating a microelectronic assembly including a built-in TEC further includes providing an electrode pattern in N-type layer 230. The provision of an electrode pattern would result in the formation of distinct N-type electrodes from layer 230. FIGS. 5a-5d depict one example of providing the electrode pattern in N-type layer 230, which example includes using lithography, or a mask/develop/etch procedure, in order to etch the electrode pattern into layer 230. In particular, as seen in FIG. 5a, the provision of an electrode pattern in layer 230 involves the provision of a resist layer 240 on first conductive layer 230. Conventional parameters may be used to provide the resist layer according to embodiments of the present invention. For example, the resist layer may be provided in the same manner as noted with respect to FIG. 3a above.

Figure 5B:
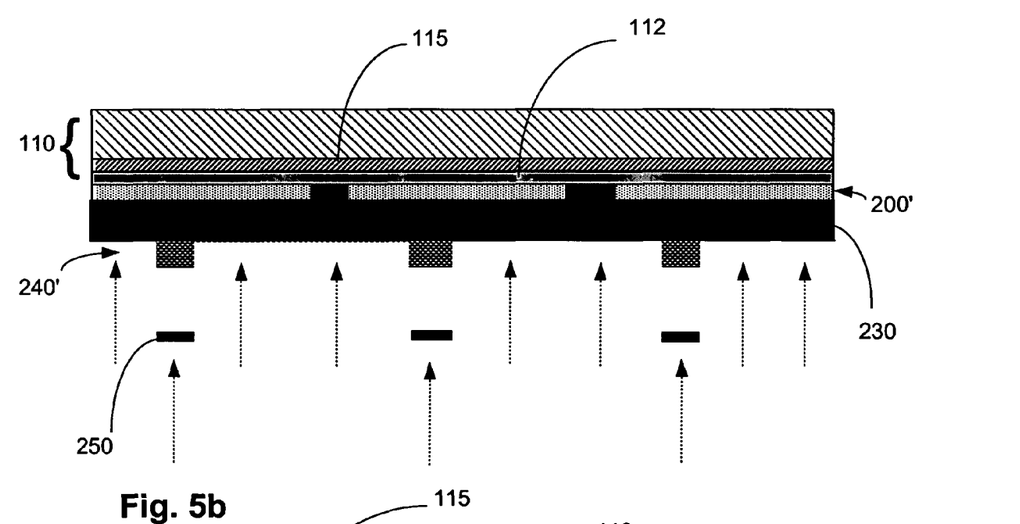

As next seen in FIG. 5b, predetermined portions of N-type layer 230 are removed as a function of the N-type electrode pattern to be provided on layer 230. As shown in FIG. 3b, according to one embodiment, removal of the predetermined portions of resist layer 240 may be achieved by exposing resist layer 240 to light through a mask 250 as shown, the mask displaying a pattern corresponding to the electrode pattern to be provided on layer 230, and thereafter by dissolving the exposed predetermined portions by using a developer solution. The electrode pattern provided by the mask 250 is transferred onto the resist layer 240 by exposing the mask 250 and resist 210 to light, such as UV light, for example by way of a stepper, as suggested by way of broken arrows in FIG. 5b. Conventional exposure parameters may be used according to embodiments of the present invention. For example, exposure may be effected in the same manner as noted with respect to FIG. 3b above. Thereafter, exposed portions of resist layer may be dissolved away using a developer solution, as is well known in the art. Conventional development parameters may be used according to embodiments of the present invention. For example, development may be effected in the same manner as noted with respect to FIG. 3b above. A removal of predetermined portions of resist layer 240 yields a patterned resist layer 240' exhibiting the electrode pattern to be provided on layer 230.

Figure 5C:
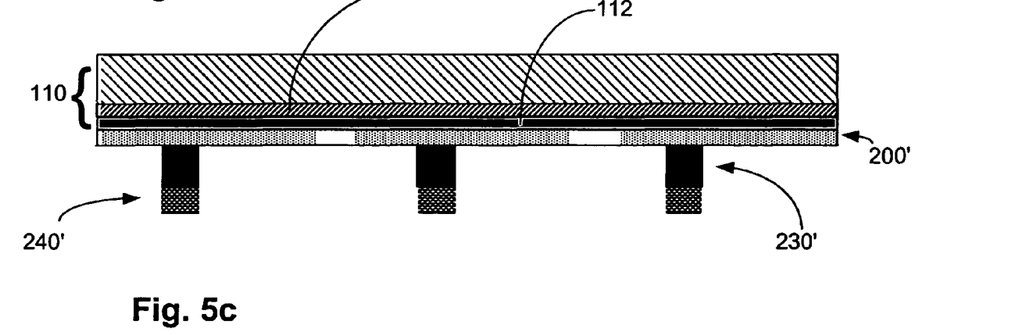
Figure 5D:
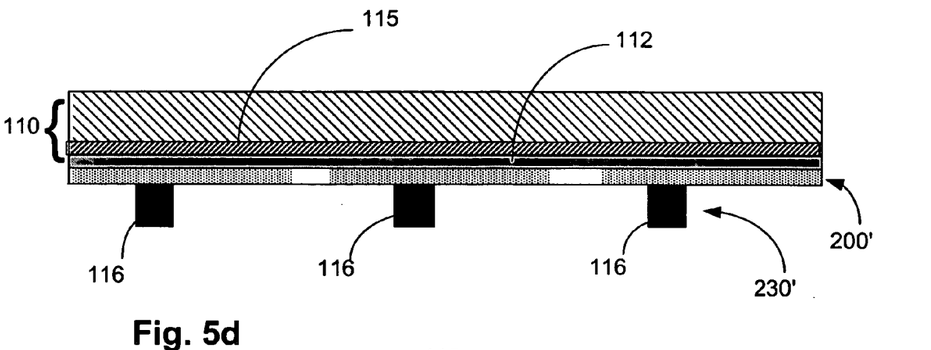
Figure 6:
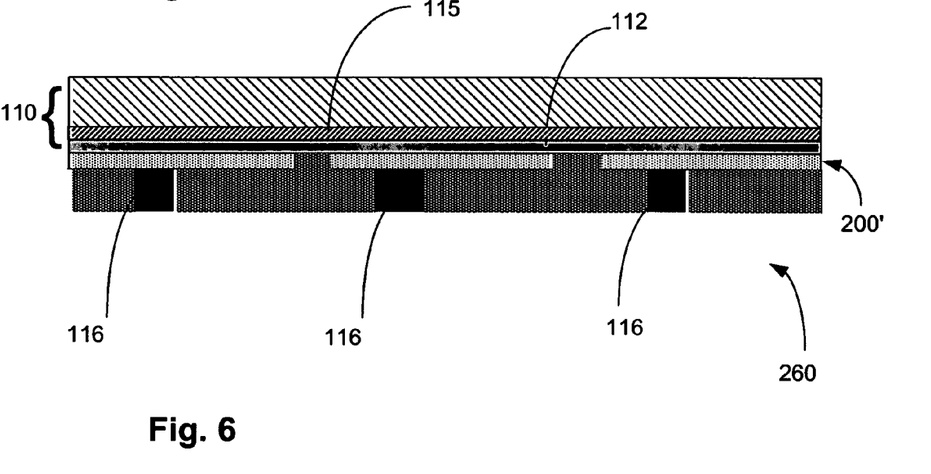

Referring next to FIG. 5c, predetermined portions of layer 230 are removed as a function of the electrode pattern to be provided on layer 230. As shown in FIG. 5c, according to one embodiment, removal of the predetermined portions of layer 230 may be achieved by etching away portions of layer 230 not protected by patterned resist layer 240'. Conventional etching parameters may used according to embodiments of the present invention. The etching may be effected in the same manner as described with respect to FIG. 3c above. For example, according to one embodiment, a plasma (dry) etcher, such as an Al etcher, may be used to etch away the unprotected predetermined portions of layer 230. The areas that are protected by resist will become the N-type electrodes 116 shown in FIG. 1. As seen in FIG. 5d, once etching is complete, an asher (also a type of plasma etcher) may be used burns off the remaining resist to yield a patterned N-type layer 230' of TE material including electrodes 116. Referring next to FIG. 6, a method of fabricating a microelectronic assembly including a built-in TEC according to an embodiment of the present invention includes providing an oxide layer 260 onto layers 200' and 230'. Oxide layer 260 may be provided in any one of well known methods as would be recognized by one skilled in the art. Oxide layer 260 fills the spaces between electrodes 116, and between conductive elements of patterned conductive layer 200' as shown.

Figure 7A:
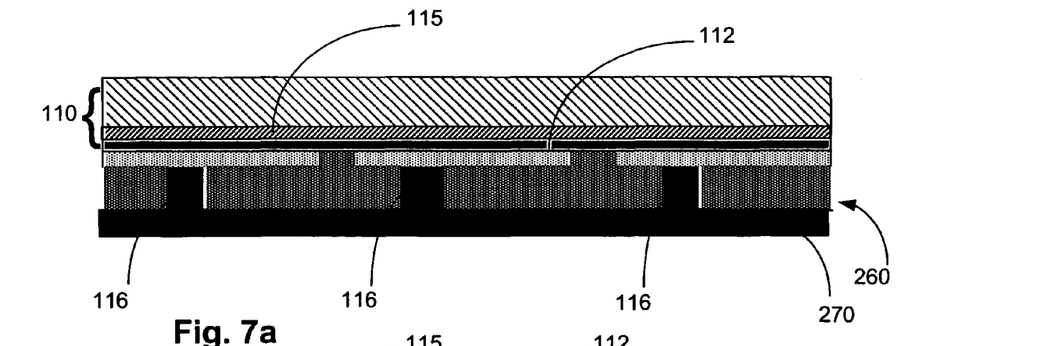

Referring next to FIGS. 7a-7d, a method of fabricating a microelectronic assembly including a built-in TEC further includes providing an electrode pattern in oxide layer 260. The provision of an electrode pattern would result in the formation of distinct P-type electrodes interspersed in layer 260. FIGS. 7a-7d depict one example of providing the electrode pattern in oxide layer 260, which example includes using lithography, or a mask/develop/etch procedure, in order to etch the electrode pattern into layer 260. In particular, as seen in FIG. 7a, the provision of an electrode pattern in layer 260 involves the provision of a resist layer 270 on first conductive layer 260. Conventional parameters may be used to provide the resist layer according to embodiments of the present invention. For example, the resist layer may be provided in the same manner as noted with respect to FIG. 3a above.

Figure 7B:
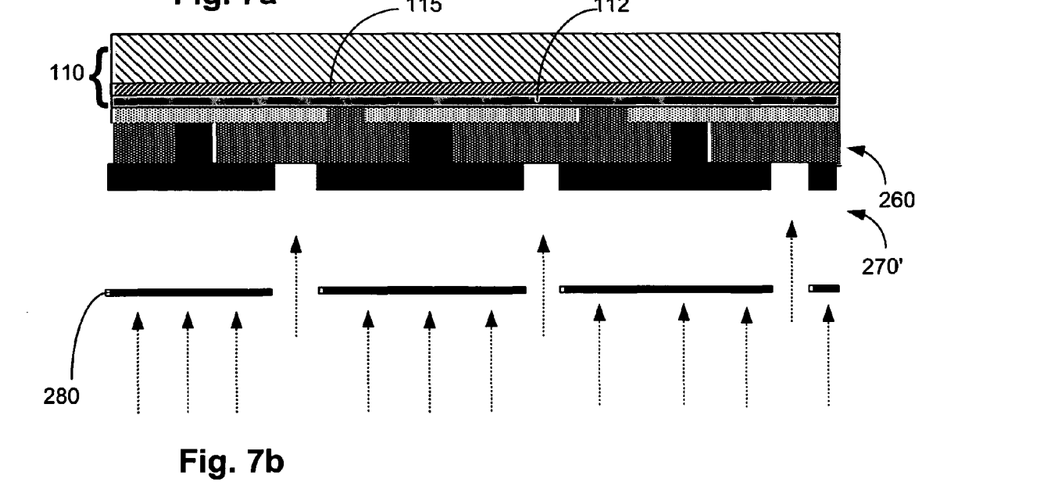
Figure 7C:
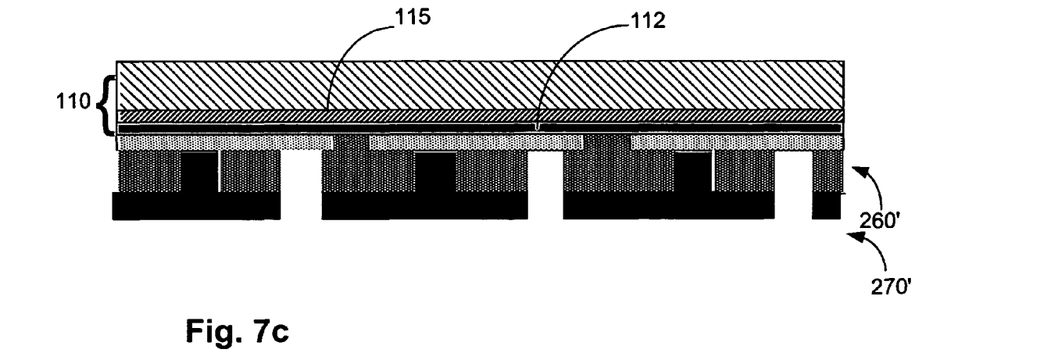
Figure 7D:
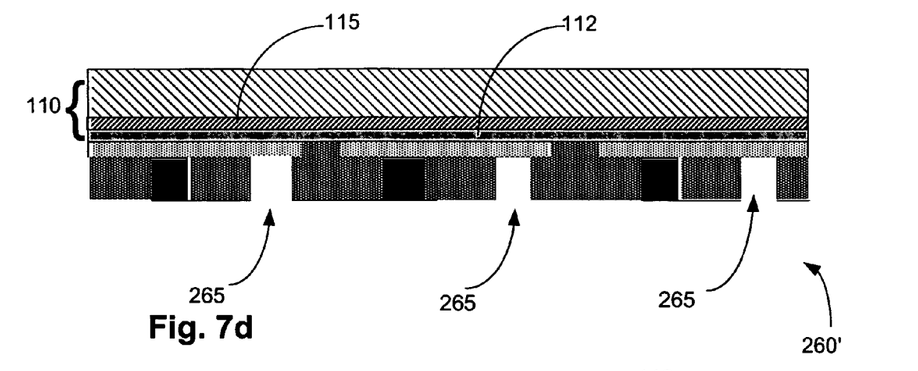

As next seen in FIG. 7b, predetermined portions of oxide layer 260 are removed as a function of the P-type electrode pattern to be provided in layer 260. As shown in FIG. 7b, according to one embodiment, removal of the predetermined portions of resist layer 270 may be achieved by exposing resist layer 270 to light through a mask 280 as shown, the mask displaying a pattern corresponding to the electrode pattern to be provided on layer 260, and thereafter by dissolving the exposed predetermined portions by using a developer solution. The electrode pattern provided by the mask 280 is transferred onto the resist layer 270 by exposing the mask 280 and resist 270 to light, such as UV light, for example by way of a stepper, as suggested by way of broken arrows in FIG. 7b. Conventional exposure parameters may be used according to embodiments of the present invention. For example, exposure may be effected in the same manner as noted with respect to FIG. 3b above. Thereafter, exposed portions of resist layer may be dissolved away using a developer solution, as is well known in the art. Conventional development parameters may be used according to embodiments of the present invention. For example, development may be effected in the same manner as noted with respect to FIG. 3b above. A removal of predetermined portions of resist layer 270 yields a patterned resist layer 270' exhibiting the electrode pattern to be provided on layer 260. Referring next to FIG. 7c, predetermined portions of layer 260 are removed as a function of the electrode pattern to be provided on layer 260. As shown in FIG. 7c, according to one embodiment, removal of the predetermined portions of layer 260 may be achieved by etching away portions of layer 260 not protected by patterned resist layer 270'. Conventional etching parameters may used according to embodiments of the present invention. The etching may be effected in the same manner as described with respect to FIG. 3c above. For example, according to one embodiment, a plasma (dry) etcher, such as an Al etcher, may be used to etch away the unprotected predetermined portions of layer 260. The areas that are protected by resist will correspond to locations of the P-type electrodes 118 shown in FIG. 1. As seen in FIG. 7d, once etching is complete, an asher (also a type of plasma etcher) may be used burns off the remaining resist to yield a patterned oxide layer 260' of TE material defining vias 265 therein.

Figure 8A:
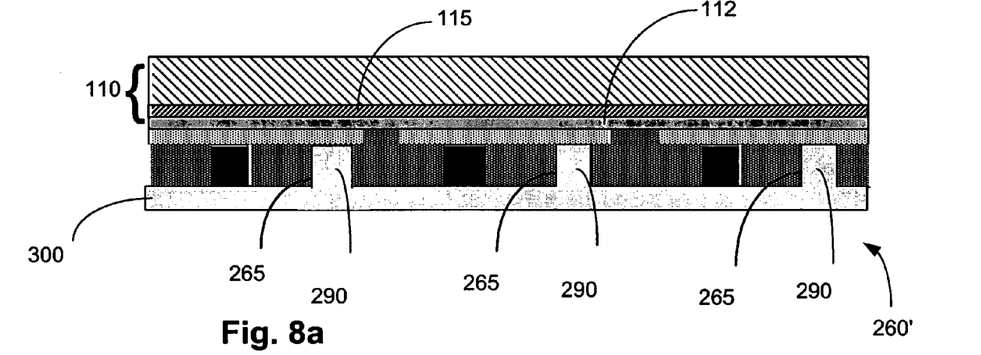
Figure 8B:
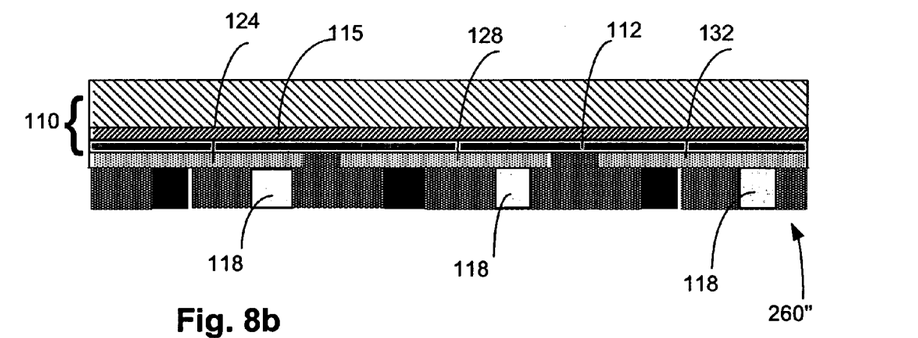

Referring next to FIGS. 8a-8b, a method of fabricating a microelectronic assembly including a built-in TEC further includes providing P-type electrodes in vias of the patterned ILD layer. The provision of P-type electrodes according to one embodiment may involve providing a P-type material 300 including P-type legs 290 of TE material in vias 265 of patterned oxide layer 260', and thereafter etching the material 300 to yield P-type electrodes 118 as shown in FIG. 1. By "legs," what is meant in the context of the instant description is a plurality of blocks of material provided for further processing to yield a component of the TEC. Provision of the P-type material 300 including P-type legs 290 may include, according to one embodiment, CVD or PVD deposition of a TE material precursor implanted with dopants, or, in the alternative, CVD deposition of a TE material precursor followed by on site doping after deposition, the deposition yielding a layer of TE material precursor on the ILD layer and in holes provided for the P-type electrodes. After provision of the P-type material 300 including P-type legs 290, parts of material 300 including parts of legs 290 may be etched back as seen in FIG. 8b to yield the P-type electrodes and a patterned oxide layer 260" as shown.

Figure 9:
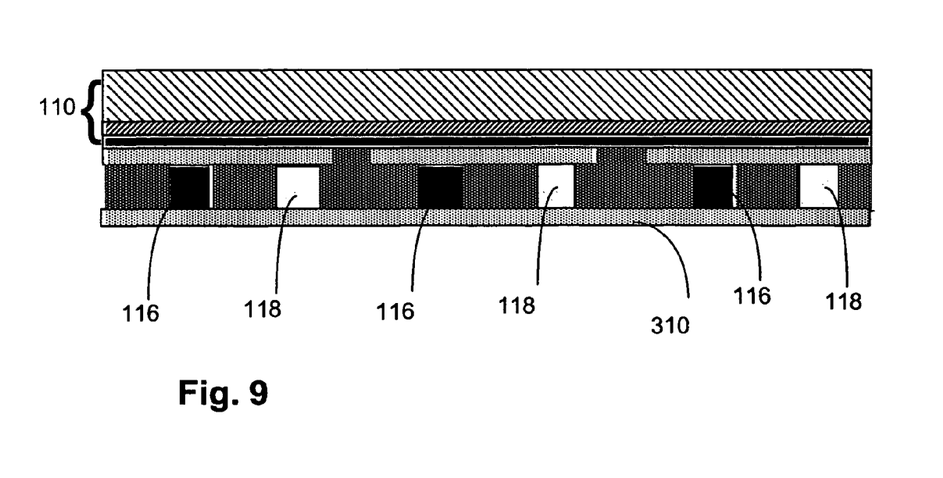

As seen in FIGS. 9 and 10a-10d, a method of fabricating a microelectronic assembly including a built-in TEC includes providing a plurality of second conductive elements, such as, for example, conductive elements 122, 126, 130 and 134 shown in FIG. 1 electrically coupled to corresponding pairs of the N- and P-type electrodes. Provision of the second conductive elements may, according to some embodiments, comprise first providing an interconnect metallization layer in the form of second conductive layer 310 on the electrodes, and then providing an interconnect pattern in the second conductive layer 310 to yield the plurality of second conductive elements. Second conductive layer 310, as shown in FIG. 9, may, similar to first conductive layer 200, comprise any conductive material, such as, for example, an aluminum copper alloy containing about 0.5% copper, or copper alone, as noted above, and may be deposited by any of well know deposition methods for depositing metallization layers, such as, for example, sputtering or evaporation.

Figure 10A:
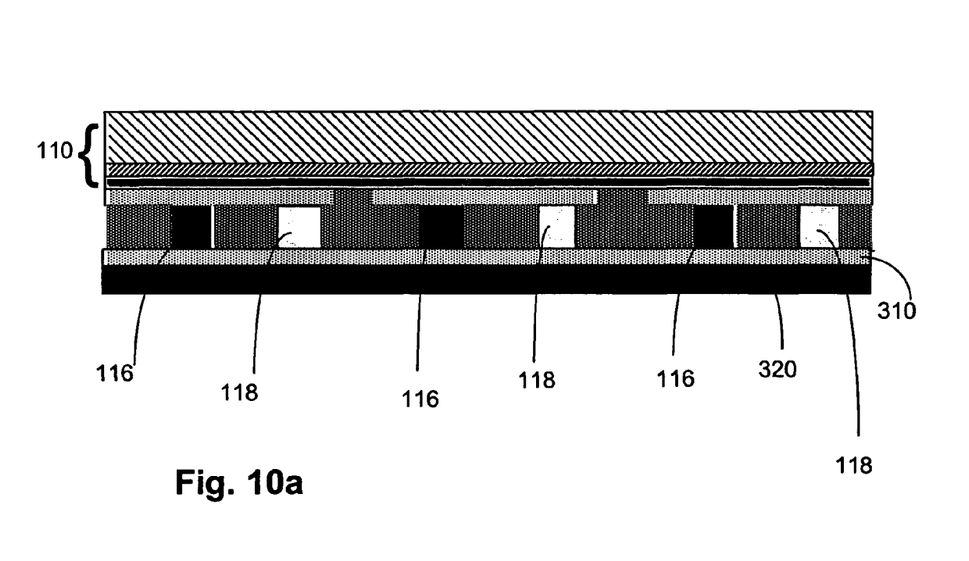

Referring next to FIGS. 10a-10d, providing an interconnect pattern in the first conductive layer 310 would result in the formation of distinct conductive elements from conductive layer 310 in order to power distinct couples of TEC 120 shown in FIG. 1. FIGS. 10a-10d depict one example of providing the interconnect pattern in second conductive layer 310, which example includes using lithography, or a mask/develop/etch procedure, in order to etch the interconnect pattern into layer 310. In particular, as seen in FIG. 10a, the provision of an interconnect pattern in layer 310 involves the provision of a resist layer 320 on second conductive layer 310. Conventional parameters may be used to provide the resist layer according to embodiments of the present invention. For example, the resist layer may be provided in the same manner as noted with respect to FIG. 3a above.

Figure 10B:
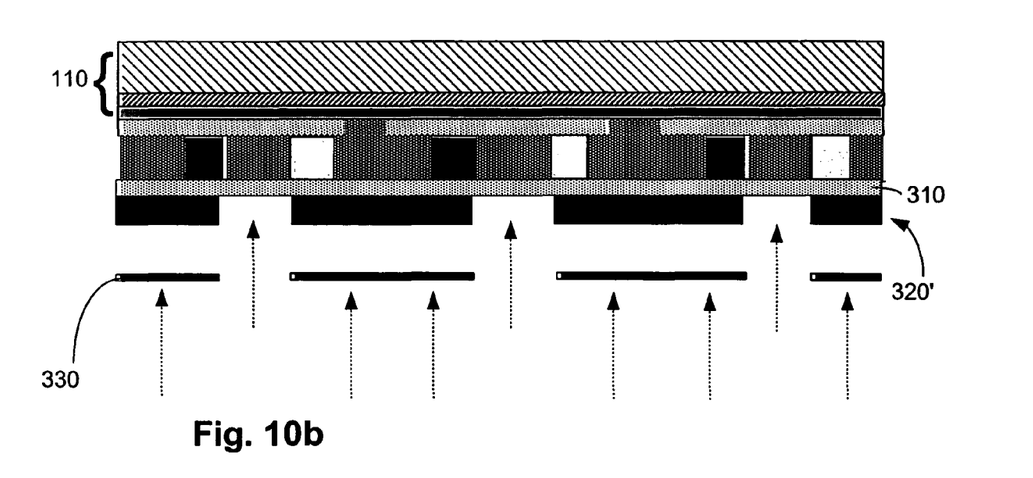
Figure 10C:
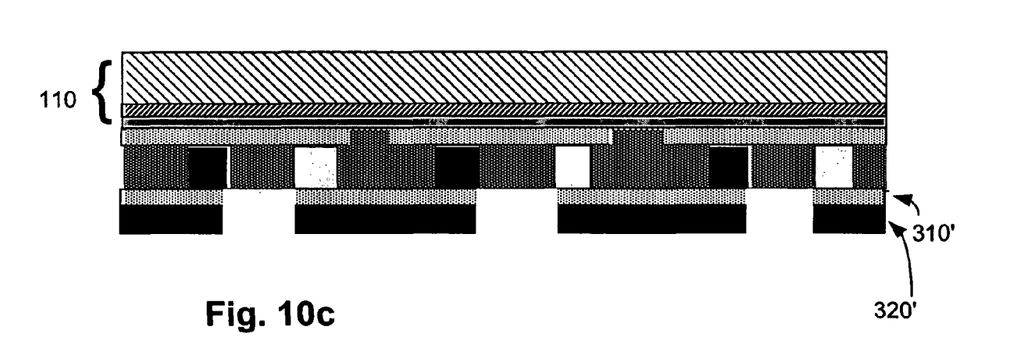
Figure 10D:
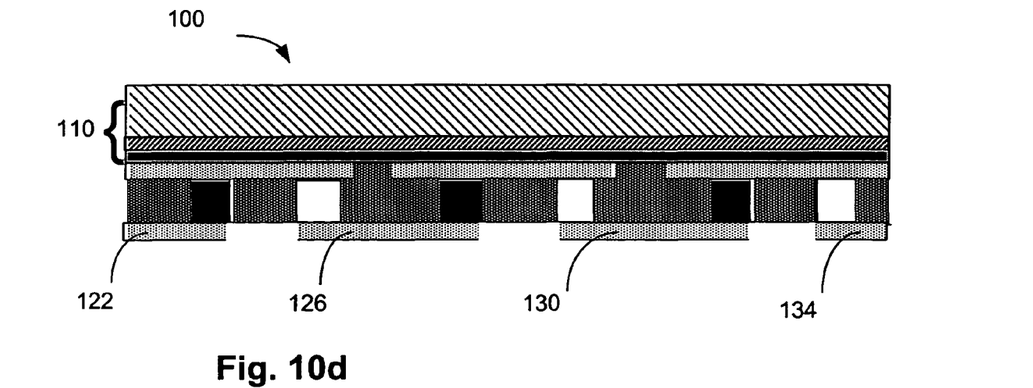

As next seen in FIG. 10b, predetermined portions of resist layer 320 are removed as a function of the interconnect pattern to be provided on layer 310. As shown in FIG. 10b, according to one embodiment, removal of the predetermined portions of resist layer 320 may be achieved by exposing resist layer 320 to light through a mask 330 as shown, the mask displaying a pattern corresponding to the interconnect pattern to be provided on layer 310, and thereafter by dissolving the exposed predetermined portions by using a developer solution. The interconnect pattern provided by the mask 330 is transferred onto the resist layer 320 by exposing the mask 330 and resist 320 to light, such as UV light, for example by way of a stepper, as suggested by way of broken arrows in FIG. 10b. The wavelength and intensity of the light, and the exposure time are all factors in properly exposing the pattern. Conventional exposure parameters may be used according to embodiments of the present invention. For example, exposure may be effected in the same manner as noted with respect to FIG. 3b above. Thereafter, exposed portions of resist layer may be dissolved away using a developer solution, as is well known in the art. The development time, temperature and concentration of the developer solution are all factors in properly dissolving the exposed resist. Conventional development parameters may be used according to embodiments of the present invention. For example, development may be effected in the same manner as noted with respect to FIG. 3b above. A removal of predetermined portions of resist layer 320 yields a patterned resist layer 320' exhibiting the interconnect pattern to be provided on layer 310. Referring next to FIG. 10c, predetermined portions of layer 310 are removed as a function of the interconnect pattern to be provided on layer 310. As shown in FIG. 10c, according to one embodiment, removal of the predetermined portions of layer 310 may be achieved by etching away portions of layer 310 not protected by patterned resist layer 320'. Conventional etching parameters may used according to embodiments of the present invention. The etching may be effected in the same manner as described with respect to FIG. 3c above. For example, according to one embodiment, a plasma (dry) etcher, such as an Al etcher, may be used to etch away the unprotected predetermined portions of layer 310. The areas that are protected by resist will become the active areas of a patterned interconnect metallization layer 310' including second conductive elements 122, 126, 130 and 134 shown in FIG. 1. As seen in FIG. 10d, once etching is complete, an asher (also a type of plasma etcher) may be used burns off the remaining resist to yield a patterned metallization layer 310'. Completing the fabrication stage shown in FIG. 10d results in the formation of a microelectronic assembly 100 including a built-in TEC, which may be used in the arrangement 102 shown in FIG. 1 and described above.

Figure 11:
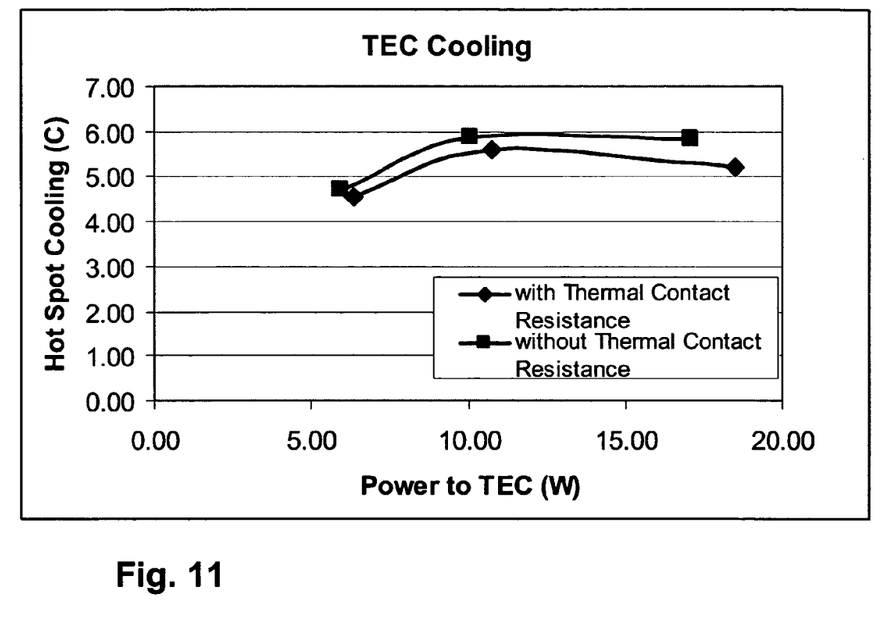
FIG. 11 is a graph showing a drop in temperature provided by a built-in TEC in a microelectronic assembly according to embodiments of the present invention, and provided by a TEC in a microelectronic assembly according to the prior art.
Figure 12:
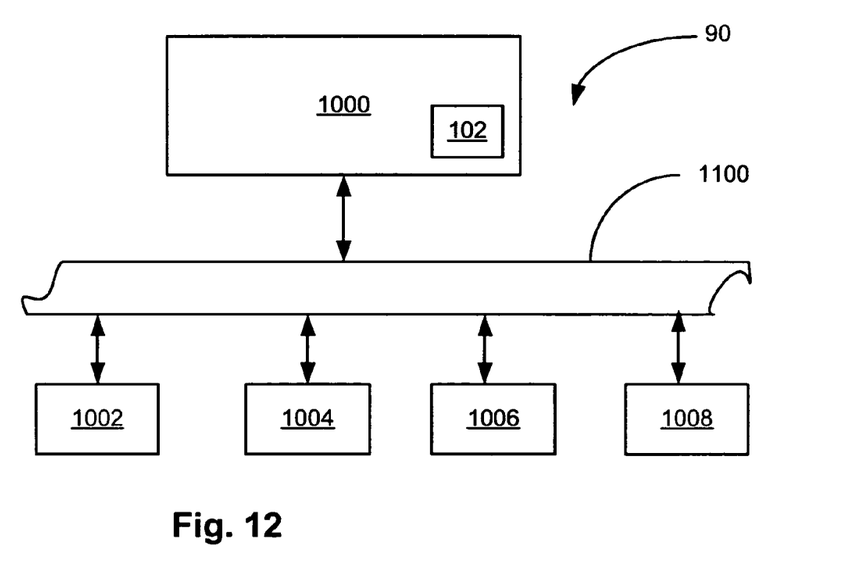
FIG. 12 is a schematic view of a system including the microelectronic assembly of FIG. 1.

Embodiments of the present invention further include within their scope a TEC, such as a single couple TEC with a single interconnect metallization conductive element on each side thereof, including exclusively P-type or exclusively N-type electrodes connected both electrically and thermally in parallel. The provision of such a TEC would be desirable according to embodiments of the present invention where the cooling of dies that are smaller than most commonly used dies is contemplatede, such as, by way of example only, the cooling of dies that may require cooling on only two spots thereon, and/or where voltage drops typically associated with a TEC containing both P-type and N-type electrodes are to be avoided, As noted above, in assemblies of the prior art including a microelectronic device to be cooled and a TEC mounted thereon, a loss of efficiency regarding TEC performance is typically caused by thermal resistance between the back of a microelectronic device to which the TEC is mounted and the attached TEC. The thermal resistance causes a temperature drop as thermal energy enters the TEC from the microelectronic device. A temperature drop on the cold side of the TEC (that is, the side directly mounted to the microelectronic device) forces the TEC to operate at a temperature that is lower than if the thermal contact resistance were not present. As a result, a cooling reduction imparted by the TEC to the hot spot of the microelectronic device is disadvantageously reduced, while the required power input to the TEC is increased. Reference is made in this regard to FIG. 11, which is a graph of the amount of cooling or delta T in degrees Celsius versus the amount of power required to be provided to the TEC in Watts. As seen in FIG. 12, a built-in TEC in a microelectronic assembly according to an embodiment of the present invention can provide a temperature reduction that is at least about ½ degree Celsius larger than a temperature reduction provided by a comparable TEC conventionally mounted to a microelectronic device according to the state of the art.

Additional advantages of embodiments of the present invention include providing a fabrication method for a TEC that allows the TEC to be specifically tailored to the size and temperature reduction requirements of a microelectronic device to be cooled, as opposed to TEC's of the prior art, which are generally manufactured according to set size and configuration standards and then mounted onto microelectronic devices without a necessary optimization of size and temperature reduction requirements. A fabrication method according to embodiments of the present invention advantageously allow microelectronic device manufacturers to thus fabricate TEC's as built-in components tailored to their specific needs, rather than having to separately purchase TEC's from TEC manufacturers and then attempt to integrate the same together with their microelectronic devices.

Referring to FIG. 12, there is illustrated one of many possible systems 900 in which embodiments of the present invention may be used, such as microelectronic arrangement 102 including microelectronic assembly 100 used in a subsystem 1000 of system 900. The subsystem 1000 may include, for example, a microprocessor. In an alternate embodiment, the subsystem 1000 may include an application specific IC (ASIC). Integrated circuits found in chipsets (e.g., graphics, sound, and control chipsets) may also be packaged in accordance with embodiments of this invention.

For the embodiment depicted in FIG. 12, the system 900 may also include a main memory 1002, a graphics processor 1004, a mass storage device 1006, and/or an input/output module 1008 coupled to each other by way of a bus 1100, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1100 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer, a set-top box, a media-center PC, a DVD player, and a server. Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method of fabricating a microelectronic assembly including a built-in thermoelectric cooler (TEC) and a microelectronic device coupled to the built-in TEC, the method comprising:
    providing the microelectronic device; fabricating the built-in TEC directly onto the microelectronic device such that there is no mounting material between the built-in TEC and the microelectronic device;
    wherein fabricating the built-in TEC comprises:
        initially forming a plurality of first conductive elements of the built-in TEC directly onto the microelectronic device;
        subsequently forming a first conductivity type layer of TE material on the plurality of first conductive elements;
        forming an electrode patterned in the first conductivity type layer to yield a plurality of first conductivity type electrodes;
        depositing an electrical insulator layer between the first conductivity type electrodes and between the first conductive elements;
        forming an electrode pattern in the electrical insulator layer to define vias therein;
        forming a plurality of second conductivity type legs of TE material in the vias defined in the electrical insulator layer; and
        etching back the second conductivity type legs to yield a plurality of second conductivity type electrodes.

2. The method of claim 1, wherein forming said plurality of first conductive elements comprises:
    providing a first conductive layer directly on the microelectronic device; and
    providing an interconnect pattern in the first conductive layer to yield the plurality of first conductive elements.

3. The method of claim 2, wherein providing a first conductive layer comprises depositing the first conductive layer using one of plating, sputtering and evaporation.

4. The method of claim 1, wherein the first conductivity type layer of TE material is implanted with dopants.

5. The method of claim 1, wherein providing the electrical insulator layer comprises using one of CVD deposition of a TEOS precursor and spin deposition of a flowable oxide precursor.

6. The method of claim 1, wherein providing a plurality of second conductivity type legs comprises using one of CVD or PVD deposition of a TE material precursor.

7. The method of claim 6, wherein the second conductivity type TE material precursor is implanted with dopants prior to deposition thereof.

8. The method of claim 6, further comprising implanting the second conductivity type TE material after deposition.

9. The method of claim 1, further comprising:
    providing a plurality of second conductive elements comprises:
        providing a second conductive layer on the first conductivity type electrodes and second conductivity type electrodes; and
        providing an interconnect pattern in the second conductive layer to yield the plurality of second conductive elements.

10. The method of claim 9, wherein providing a second conductive layer comprises depositing the second conductive layer using one of plating, sputtering and evaporation.

11. The method of claim 1, wherein providing a microelectronic device comprises providing a die having an oxide layer on a side thereof adapted to be coupled to the TEC.

12. The method of claim 11, wherein the built-in TEC is fabricated directly onto the oxide layer of the die.

13. The method of claim 12, wherein forming said plurality of first conductive elements comprises:
    depositing a first conductive layer directly onto the oxide layer of the die during fabrication of the built-in TEC.

* * * * *